US006806754B2

United States Patent
Harrison et al.

(10) Patent No.: US 6,806,754 B2
(45) Date of Patent: Oct. 19, 2004

(54) METHOD AND CIRCUITRY FOR REDUCING DUTY CYCLE DISTORTION IN DIFFERENTIAL DELAY LINES

(75) Inventors: Ronnie M. Harrison, Boise, ID (US); Brent Keeth, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/909,448

(22) Filed: Jul. 19, 2001

(65) Prior Publication Data

US 2003/0016065 A1 Jan. 23, 2003

(51) Int. Cl.⁷ .............................................. H03H 11/26
(52) U.S. Cl. ...................................... 327/284; 327/175
(58) Field of Search ................................ 327/261, 266, 327/269–272, 274, 280, 281, 284, 287, 149, 153, 161, 175, 176, 239, 564–566; 375/371, 373; 365/194, 233; 326/101–103; 331/DIG. 2, 46, 50

(56) References Cited

U.S. PATENT DOCUMENTS

| | | | |
|---|---|---|---|
| 5,374,860 A | * 12/1994 | Llewellyn | 327/261 |
| 5,412,697 A | 5/1995 | Van Brunt et al. | 375/360 |
| 5,619,541 A | 4/1997 | Van Brunt et al. | 375/360 |
| 5,672,991 A | * 9/1997 | Thoma et al. | 327/239 |
| 5,734,187 A | 3/1998 | Bohr et al. | 257/377 |
| 5,745,420 A | 4/1998 | McClure | 365/201 |
| 5,815,050 A | * 9/1998 | Brooks et al. | 333/156 |
| 5,864,181 A | * 1/1999 | Keeth | 257/776 |
| 6,011,732 A | * 1/2000 | Harrison et al. | 365/191 |
| 6,043,562 A | 3/2000 | Keeth | 257/776 |
| 6,052,003 A | * 4/2000 | Molin et al. | 327/112 |
| 6,163,475 A | 12/2000 | Proebsting | 365/63 |

* cited by examiner

Primary Examiner—Minh Nguyen
(74) Attorney, Agent, or Firm—TraskBritt, PC

(57) ABSTRACT

A method and circuitry are provided for reducing duty cycle distortion in differential solid state delay lines. The differential solid state delay lines of the present invention include a plurality of delay line cells or stages connected in series. Because there may be asymmetry associated with the physical layout of each individual delay line cell or stage, it is advantageous to cross-connect every x stage of an n-stage delay line. Method, integrated circuit, electronic system and substrate embodiments including the differential solid state delay lines are also disclosed.

22 Claims, 8 Drawing Sheets

METHOD AND CIRCUITRY FOR REDUCING DUTY CYCLE DISTORTION IN DIFFERENTIAL DELAY LINES

FIELD OF THE INVENTION

The present invention relates to integrated circuitry, generally. More specifically, the present invention relates to methods and circuitry for reducing duty cycle distortion in differential delay lines used in integrated circuits.

BACKGROUND OF THE INVENTION

Delay circuitry is commonly used in both analog and digital circuitry to delay signals as needed. In synchronous digital integrated circuitry, delay circuits are frequently used to precisely time signals. Delay circuitry can take many different forms. Some delay circuitry is designed to delay a single electrical signal.

A simple delay circuit may take the form of an inverter. Logic gates have delays associated with signals propagating through them. Where the logical state of the input signal must be preserved, a noninverting delay may be used. Alternatively, an even number of inverters may be used to preserve the logical state of the input signal. For example, a pair of series-connected inverters will delay an input signal for two gate delays. Any number of delay circuits may be cascaded in series to adjust, or design, for a particular delay duration.

Differential delay lines are used in synchronous digital integrated circuitry to delay a pair of electrical lines that may form a single signal of interest, e.g., a differential voltage. Cascading such differential delay lines for a desired delay is known in the art. However, there are problems associated with cascaded differential solid state delay lines. A differential solid state delay line, even though perfectly symmetrical at the schematic level, may suffer duty cycle distortion due to process and layout asymmetry. Additionally, duty cycle distortion may result in differential solid state delay lines from thermal gradients in the semiconductor device itself. Thus, there is a need in the art for methods and circuitry for reducing duty cycle distortion in differential delay lines used in integrated circuits.

SUMMARY OF THE INVENTION

The invention is a method and circuitry for reducing duty cycle distortion in differential solid state delay lines. The differential solid state delay lines of the present invention include a plurality of delay line cells or stages connected in series. Because there may be asymmetry associated with the physical layout of each individual delay line cell or stage, it is advantageous to cross-connect every x stage of an n-stage delay line.

A differential solid state delay line embodiment of the invention includes n differential delay cells wherein each of the differential delay cells includes a first input associated with a first output and a second input associated with a second output, wherein each of the n differential delay cells is connected in series to form the differential solid state delay line. The differential further includes an even number of the n differential delay cells being cross-connected, that is, a first output of a preceding one of the n differential delay cells is connected to a second input of a succeeding one of the n differential delay cells and a second output of the preceding one of the n differential delay cells is connected to a first input of the succeeding one of the differential delay cells.

A physical layout embodiment for a differential solid state delay line includes a plurality of individual differential delay cell layouts. Each of the individual differential delay cell layouts includes a first delay element physical layout having a first input and a first output and a second delay element physical layout having a second input and a second output. The first delay element physical layout may be asymmetrical relative to the second delay element physical layout. The plurality of individual differential delay cell layouts are abutted against one another. An even number of the abutted plurality of identical individual differential delay cell layouts are cross-connected. Cross-connected includes a first output from a preceding differential delay cell layout being connected to a second input of a succeeding differential delay cell layout, and a second output from the preceding differential delay cell layout being connected to a first input of the succeeding differential delay cell layout.

A method for reducing duty cycle distortion in differential delay lines in accordance with the present invention includes providing a plurality of differential solid state delay cells, wherein each of the plurality of differential solid state delay cells includes a first delay element having a first input coupled to a first output and a second delay element having a second input coupled to a second output. The first delay element is configured for delaying a first electrical signal input to the first input and for outputting the first electrical signal on the first output after a delay. The second delay element is configured for delaying a second electrical signal input to the second input and for outputting the second electrical signal on the second output after the delay. The plurality of differential solid state delay cells are cross-connecting in series an even number of times.

Another method embodiment for reducing duty cycle distortion in differential solid state delay lines includes generating a physical layout for a differential solid state delay circuit, the physical layout comprising a first delay element having a first input coupled to a first output and a second delay element with a second input coupled to a second output. The method further comprises assembling n stages of the physical layouts in series to form an outline of a differential solid state delay line and cross-connecting every x of the n stages, where x is an even integer.

Integrated circuit, electronic system and substrate embodiments including the differential solid state delay lines of the present invention are also disclosed.

BRIEF DESCRIPTION OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

The invention is a method and circuitry for reducing duty cycle distortion in differential delay lines. The differential delay lines of the present invention may be used in a kind of integrated circuit. In the following detailed description of the preferred embodiments, reference is made to the accompanying drawings, which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1A:
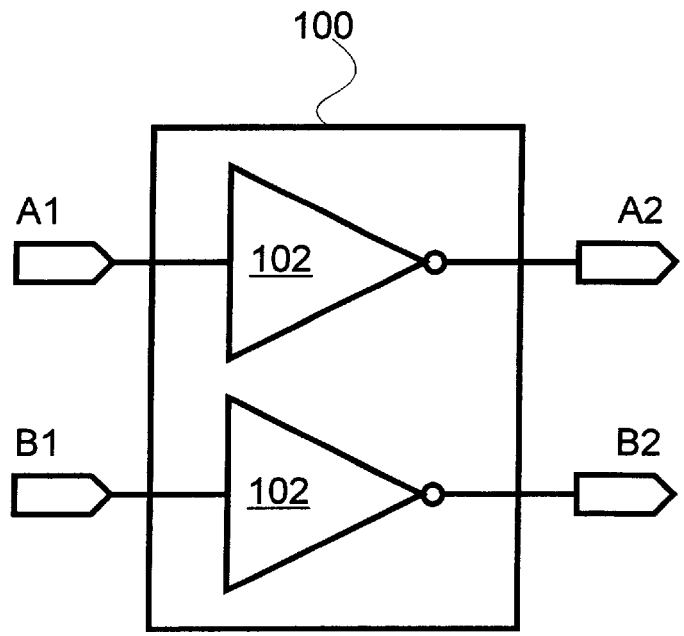
FIGS. 1A and 1B are logic diagrams of inverting and noninverting differential solid state delay circuits, respectively.

FIG. 1A illustrates a logic diagram of an inverting differential solid state delay circuit 100. Inverting differential solid state delay circuit 100 includes two inverters 102. The first inverter 102 (top) has input signal A1 and output signal A2. The second inverter 102 (bottom) has input signal B1 and output signal B2. Input signal A1 and input signal B1 are delayed by the gate delay of inverters 102 before being output as output signal A2 and output signal B2. Output signal A2 and output signal B2 are logically opposite of input signal A1 and B1, respectively. If output signals of the same logic level as the input signal are desired, an even number of inverting differential solid state delay circuits 100 may be connected in series, see FIGS. 2A, 2B. One or more inverting differential solid state delay circuits 100 may be used, for example and not by way of limitation, to delay and invert a pair of differential signal lines D and D* (not shown) from a solid state memory circuit.

Figure 1B:
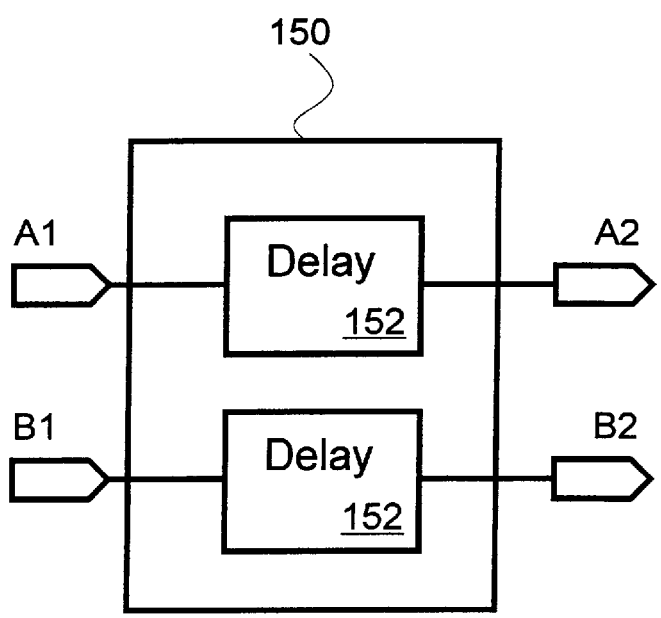

FIG. 1B illustrates a logic diagram of a noninverting differential solid state delay circuit 150. Noninverting differential solid state delay circuit 150 includes two delay elements 152. The first delay element 152 (top) has input signal A1 and output signal A2. The second delay element 152 (bottom) has input signal B1 and output signal B2. Input signal A1 and input signal B1 are delayed through delay elements 152 before being output as output signal A2 and output signal B2. Of course, delay elements 152 may be noninverting buffers, as known to one of ordinary skill in the art.

Figure 2A:
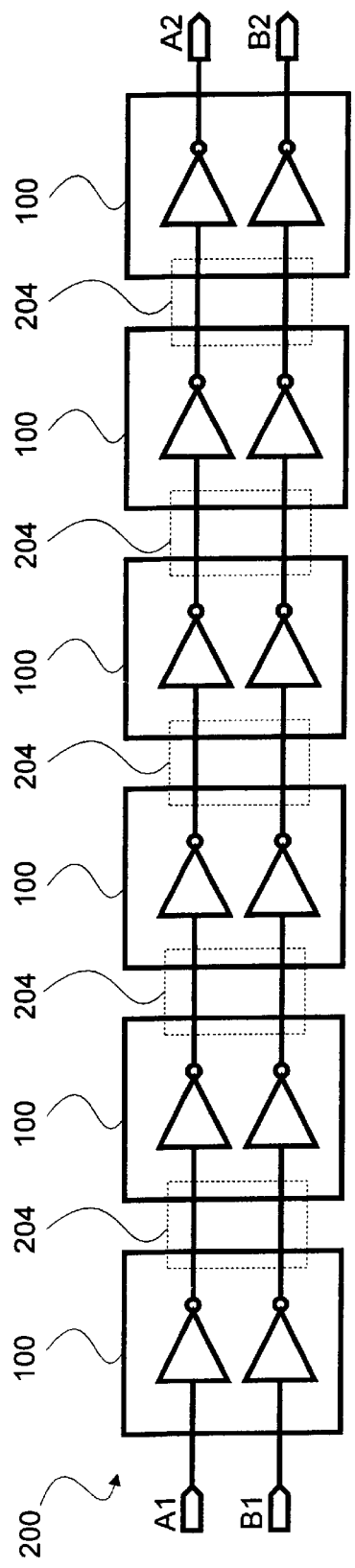
FIG. 2A is a schematic of a conventional differential solid state delay line incorporating a series of the inverting differential solid state delay circuits illustrated in FIG. 1A, wherein each stage has straight-through interconnects.

FIG. 2A is a schematic of a conventional differential solid state delay line 200 incorporating a series of the inverting differential solid state delay circuits 100 illustrated in FIG. 1A. Note that each stage (there are six circuits 100) of the conventional differential solid state delay line 200 is connected in series with "straight-through" connections 204 (inside dotted box). The problem with "straight-through" connections 204 is that any layout asymmetry associated with the physical layout of each differential solid state delay circuit 100 is compounded with each stage.

Figure 2B:
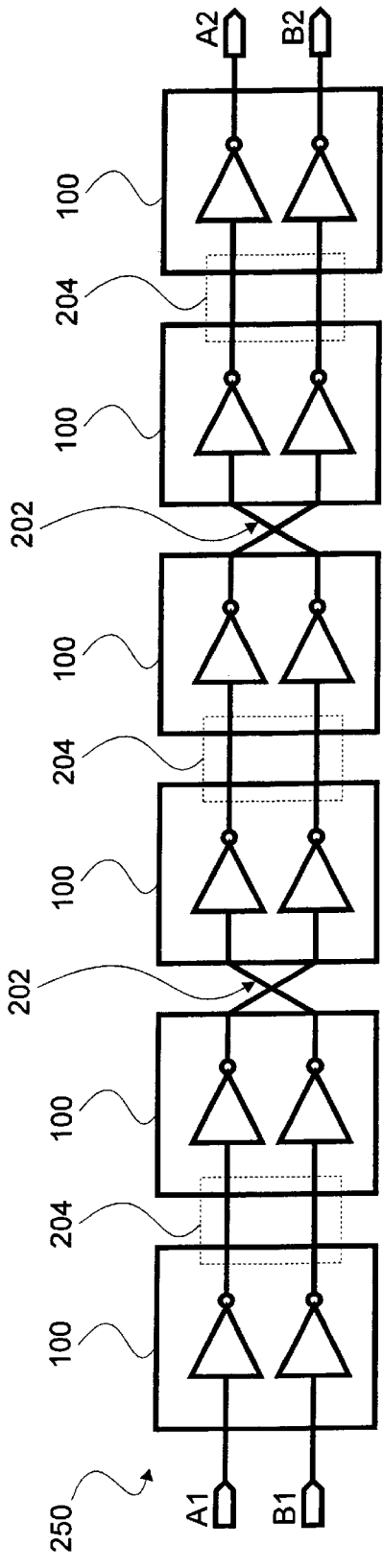
FIG. 2B is a schematic of a differential solid state delay line incorporating a series of the inverting differential solid state delay circuits illustrated in FIG. 1A, showing twisted delay line interconnects in accordance with the present invention.

FIG. 2B is a schematic of a differential solid state delay line 250 in accordance with the present invention. FIG. 2B illustrates twisted delay line interconnects 202 in accordance with the present invention. In order to reduce the effect of any layout asymmetry associated with the physical layout of each differential solid state delay circuit 100, an even number of stages are cross-connected (or twisted), such that the "A2" and "B2" outputs of the preceding stage are connected to the "B1" and "A1" inputs of the succeeding stage, respectively. Each stage (circuits 100, 150) has an identical physical layout. Preferably, twisting of the interconnections between stages occurs every n stages of the delay line, where n is an even integer. Alternatively, every interconnect between stages of a differential delay line may include twisted delay line interconnects 202.

Figure 3:
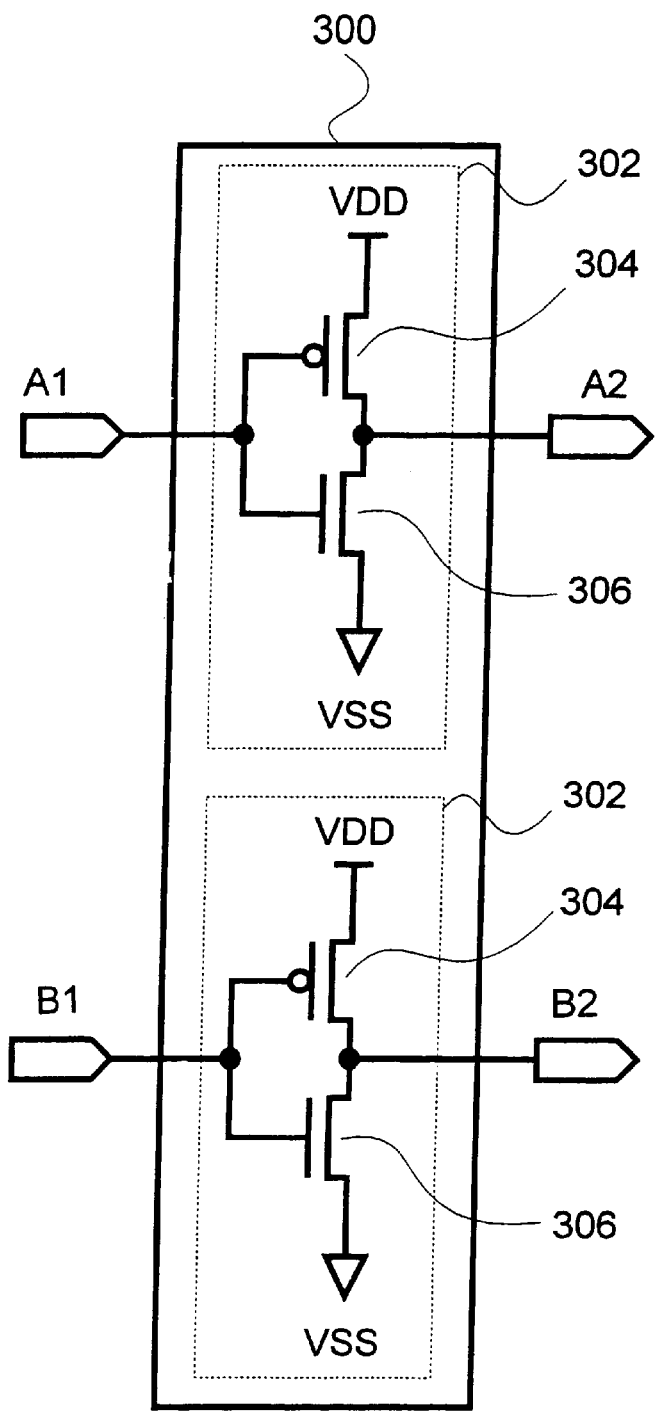
FIG. 3 is a schematic diagram of a CMOS embodiment of the inverting differential solid state delay circuit of FIG. 1A.

FIG. 3 is a schematic diagram of a complementary metal oxide semiconductor (CMOS) embodiment 300 of the inverting differential solid state delay circuit 100 of FIG. 1A. Each inverter 302 comprises a PMOS transistor 304 and an NMOS transistor 306 configured to receive an input signal (A1, B1) and output a logically inverted signal (A2 and B2, respectively) as known to one of ordinary skill in the art.

Figure 4:
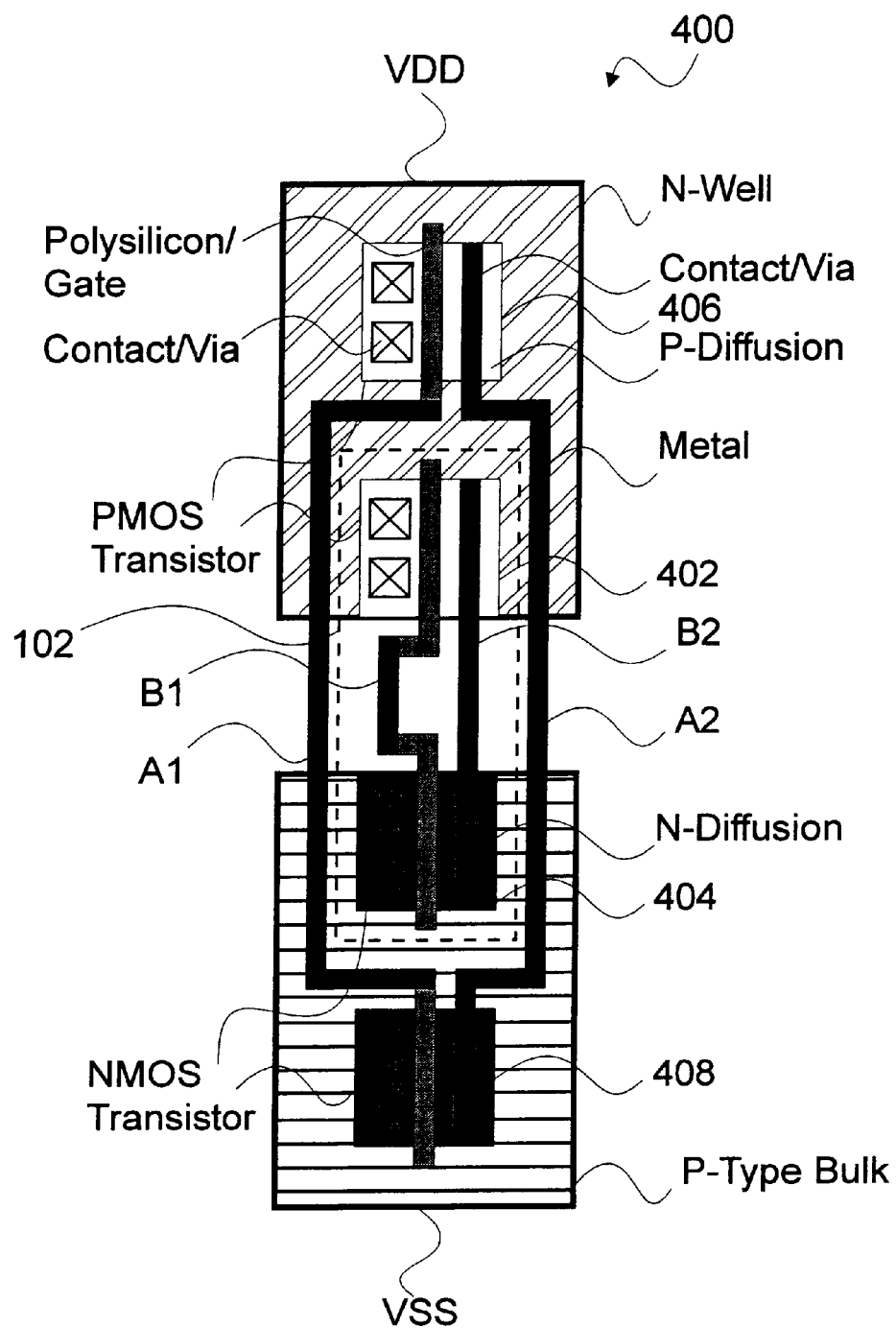
FIG. 4 is a physical layout of a CMOS embodiment of the inverting differential solid state delay circuit of FIG. 1A.

FIG. 4 is a physical layout 400 of a CMOS embodiment of the inverting differential solid state delay circuit 100 of FIG. 1A. It should be readily apparent that the inverter 102 (inside dotted box) formed by PMOS transistor 402 and NMOS transistor 404 has an asymmetrical physical layout relative to the inverter (outside dotted box) formed by PMOS transistor 406 and NMOS transistor 408. The physical layout of a noninverting differential solid state delay circuit (not shown), such as that illustrated in FIG. 1B, may also introduce asymmetry in the signal paths taken by the two inputs A1 and B1 to arrive at outputs A2 and B2, respectively. Note that physical layout 400 is exemplary only and may not follow any particular layout design rules.

Figure 5:
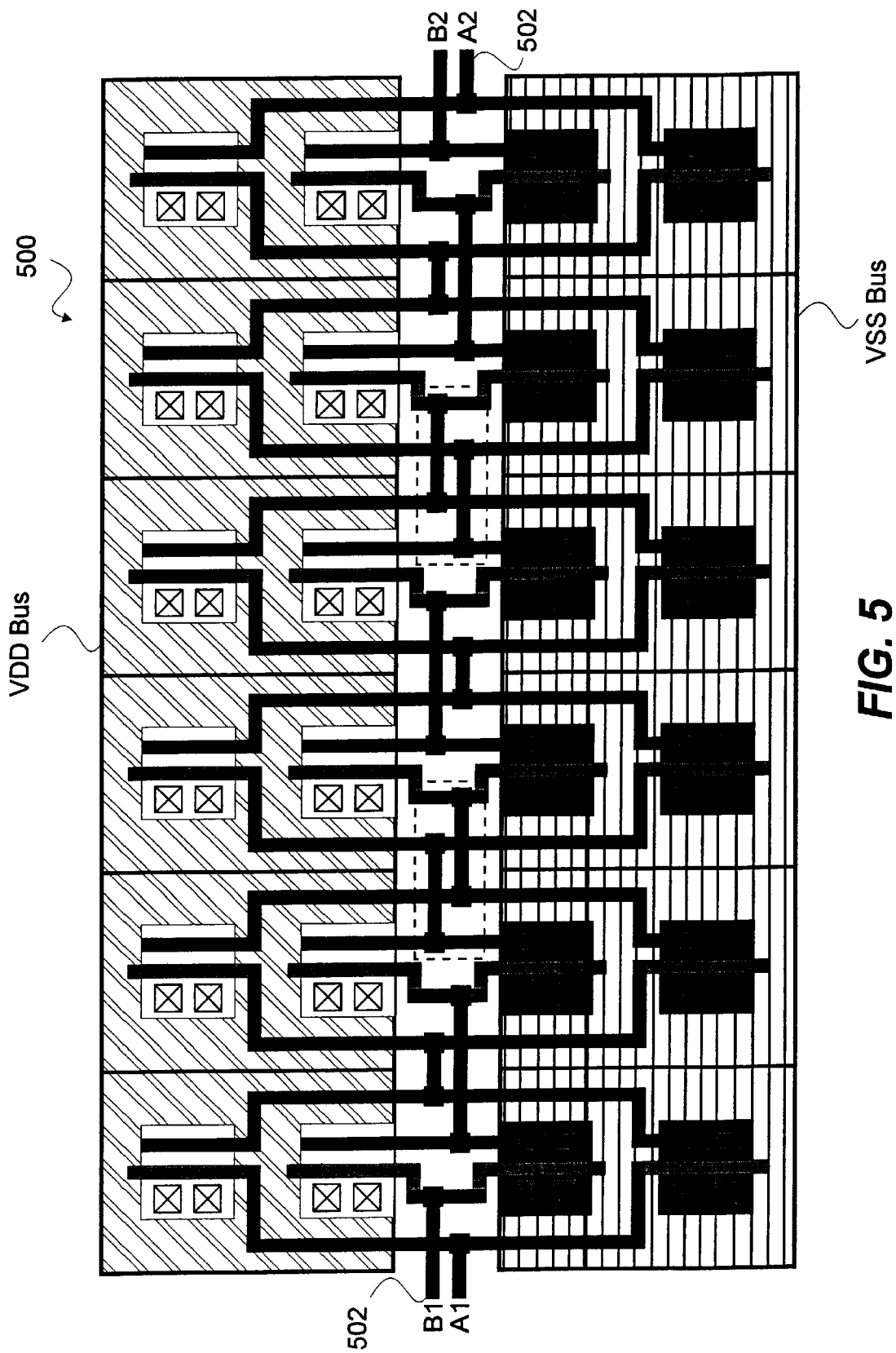
FIG. 5 is a physical layout of the differential solid state delay line of FIG. 2B illustrating twisted delay lines in accordance with the present invention.

FIG. 5 is a physical layout 500 of the differential solid state delay line 250 of FIG. 2B illustrating twisted delay lines in accordance with the present invention. Note that each stage of the differential solid state delay line is identical. Interconnections are formed between the stages with short metal interconnects 502. Note the cross-connections in the dotted boxes, wherein signal B2 of a preceding differential solid state delay circuit is connected to signal A1 of a succeeding differential solid state delay circuit and signal A2 of a preceding differential solid state delay circuit is connected to signal B1 of a succeeding differential solid state delay circuit. Note that physical layout 500 is exemplary only and may not follow any particular layout design rules.

Figure 6:
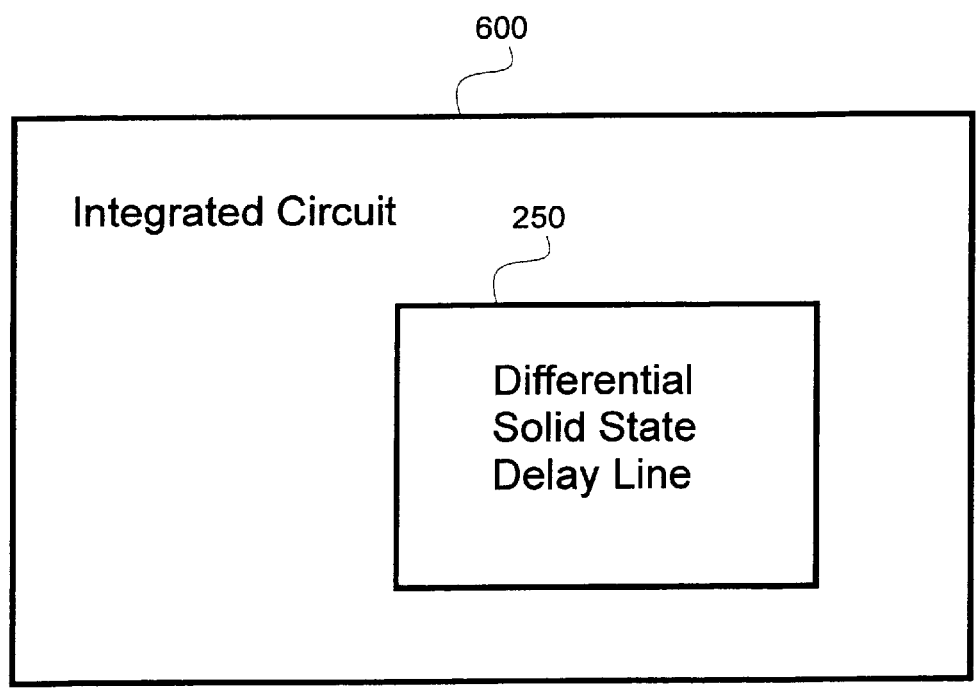
FIG. 6 is an integrated circuit including a differential solid state delay line in accordance with the present invention.

FIG. 6 is an integrated circuit 600 including a differential solid state delay line 250 in accordance with the present invention. Integrated circuit 600 may be, for example and not by way of limitation, a processor, memory device, dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (SBT™ SRAM), Quad Data Rate™ SRAM (QDR™ SRAM), DDR synchronous SRAM (DDR SRAM) or nonvolatile electrically block-erasable programmable read only memory (Flash).

Figure 7:
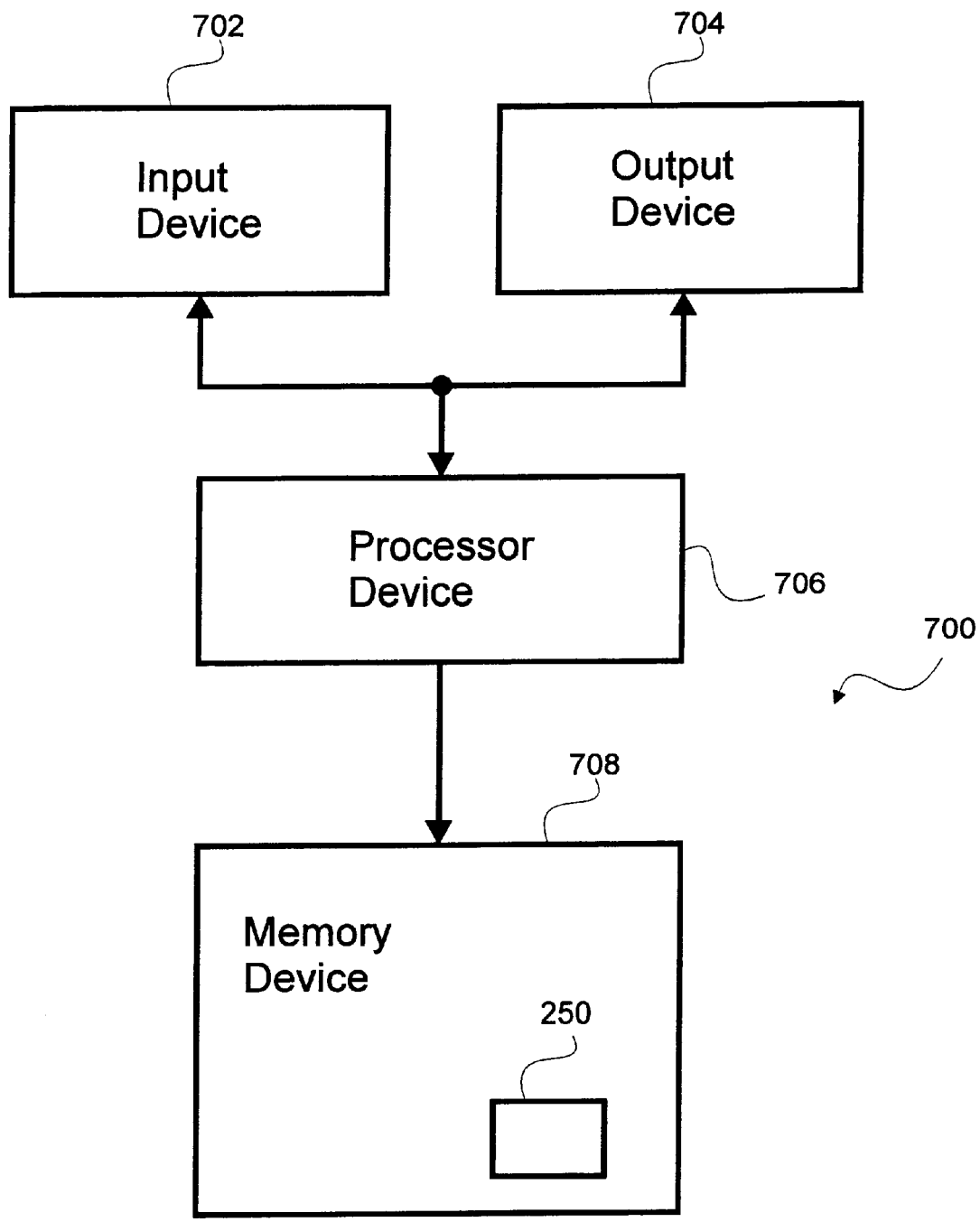
FIG. 7 is an electronic system including a differential solid state delay line in accordance with the present invention.

FIG. 7 is an electronic system 700 in accordance with the present invention. System 700 may include an input device 702, an output device 704, a processor device 706 and a memory device 708. Memory device 708 includes a differential solid state delay line 250 in accordance with the present invention. Input device 702 may be a keyboard, mouse, joystick or any other input device. Output device 704 may be a computer monitor, printer or any other suitable output device. Processor device 706 may be a general purpose microprocessor or a circuit card with a processor on-board. Processor device 706 may be a digital signal processor or any other kind of special purpose processor. Memory device 708 may be a memory integrated circuit 600, a memory card, a single in-line memory module (SIMM), a dual in-line memory module (DIMM) or any other kind of memory module known to one of skill in the art.

Figure 8:
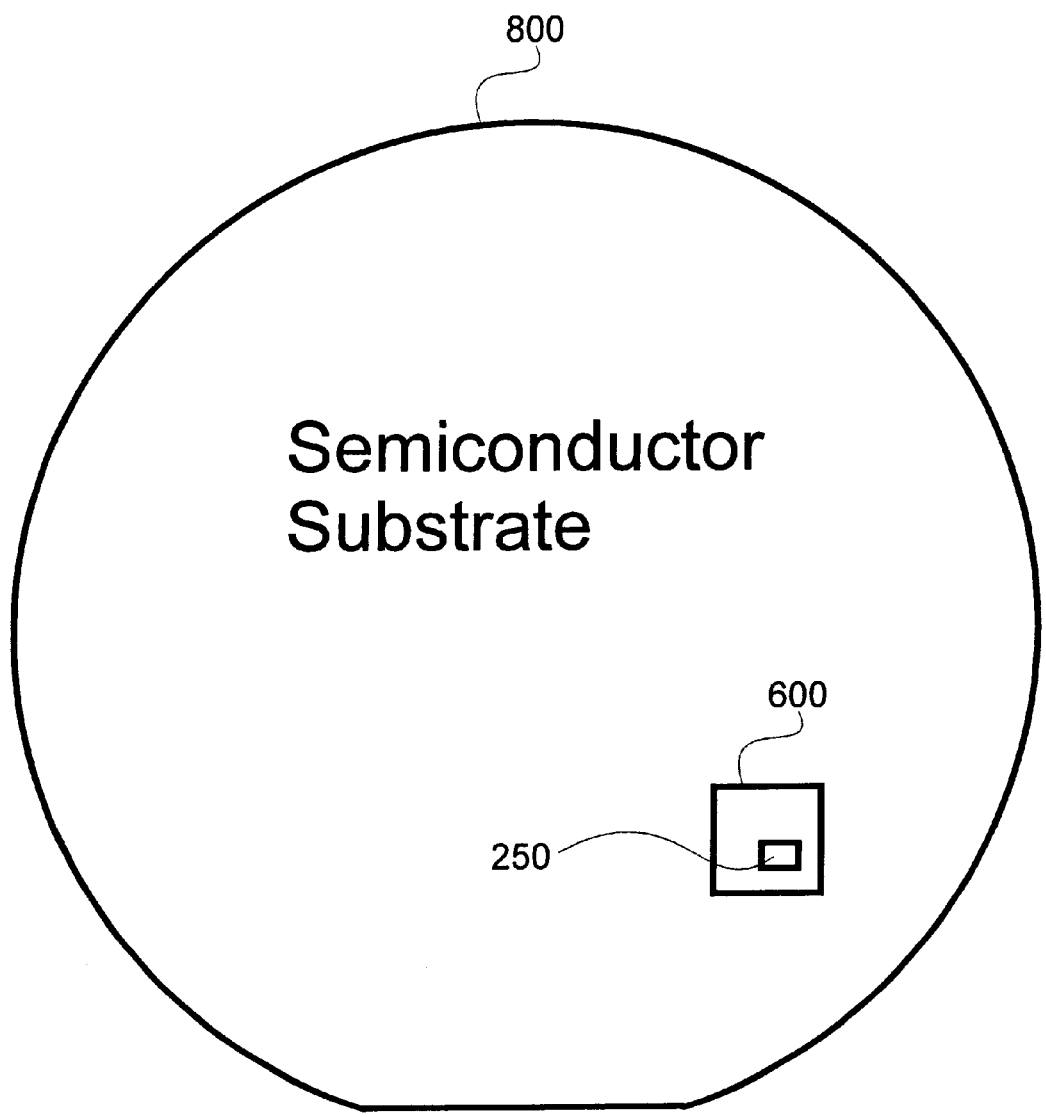
FIG. 8 is a semiconductor substrate including at least one integrated circuit including a differential solid state delay line in accordance with the present invention.

FIG. 8 is a semiconductor substrate 800 including at least one integrated circuit 600 including a differential solid state delay line 250 in accordance with the present invention.

The semiconductor technology employed is not a limiting factor in the application of the differential solid state delay lines with twisted delay lines of the present invention. While silicon is the preferred bulk semiconductor material for commercial electronic devices, gallium arsenide and indium phosphide substrates may also be employed. Of course, it will be understood that the devices of the present invention may be fabricated on other semiconductor substrates as well, including, for example, silicon-on-glass (SOG) substrates, silicon-on-insulator (SOI) substrates, and silicon-on-sapphire (SOS) substrates. Additionally, while CMOS technology is used in the exemplary embodiments described herein, the invention is not so limited. Other semiconductor processing technologies for forming electronic devices such as differential delay cells may also be applicable to the present invention.

Although this invention has been described with reference to particular embodiments, the invention is not limited to these described embodiments. Rather, it should be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. A differential solid state delay line reducing duty cycle distortion in differential solid state delay lines, comprising: n number of substantially identical differential delay cells, each cell of said n number of differential delay cells including a first input associated with a first output and a second input associated with a second output, at least one present of process asymmetry, layout asymmetry and duty-cycle-induced signal distortion regarding circuitry between the first input and the first output in comparison to circuitry between the second input and the second output, each cell of said n number of differential delay cells being connected in series for forming said differential solid state delay line and an even number of said n number of differential delay cells being cross-connected using a twisted line interconnect between differential delay cells having the first output of a preceding one cell of said n number of differential delay cells being connected to the second input of a succeeding one cell of said n number of differential delay cells and the second output of said preceding one cell of said n number of differential delay cells being connected to the first input of said succeeding one cell of said n number of differential delay cells reducing duty cycle distortion in the circuitry between the first input and the first output in comparison to the circuitry between the second input and the second output.

2. The differential solid state delay line of claim 1, wherein each of said n number of differential delay cells inverts each of both signals presented at said first input and said second input when each of said signals is delayed and output on said associated first output and said associated second output, respectively.

3. The differential solid state delay line of claim 1, wherein each of said n number of differential delay cells comprises:
a delay element between said first input and said associated first output; and
a delay element between said second input and said associated second output.

4. The differential solid state delay line of claim 3, wherein each of said delay elements is an inverter.

5. The differential solid state delay line of claim 3, wherein each of said delay elements is a buffer.

6. A differential solid state delay line reducing duty cycle distortion in differential solid state delay lines, comprising:
a plurality of substantially identical differential solid state delay cells, each differential solid state delay cell comprising:
a first delay element having a first input and a first output and having a second delay element with a second input and a second output, at least one occurring of process asymmetry, layout asymmetry and duty-cycle-induced signal distortion regarding circuitry between the first input and the first output in comparison to circuitry between the second input and the second output, a first electrical signal input to said first input being delayed through said first delay element and output as said first electrical signal delayed on said first output and a second electrical signal input to said second input being delayed through said second delay element and output as said second electrical signal delayed on said second output, each of said plurality of differential solid state delay cells being configured for connecting in series with each other without cross-connecting having a first output of a preceding differential solid state delay cell connected to a first input of a succeeding differential solid state delay cell and a second output of said preceding differential solid state delay cell connected to a second input of said succeeding differential solid state delay cell and each of said plurality of differential solid state delay cells being further connecting in series with each other with cross-connecting using a twisted line interconnect between connected differential solid state delay cells having said preceding differential solid state delay cell first output connected to said succeeding differential solid state delay cell second input and said preceding differential solid state delay cell second output connected to said succeeding differential solid state delay cell first input reducing duty cycle distortion in the circuitry between the first input and the first output in comparison to the circuitry between the second input and the second output.

7. The differential solid state delay line of claim 6, wherein said first delay element and said second delay element are both buffers.

8. The differential solid state delay line of claim 6, wherein said first delay element and said second delay element are both inverters.

9. The differential solid state delay line of claim 6, further comprising an even number of twisted line interconnects between said plurality of differential solid state delay cells.

10. A physical layout for a differential solid state delay line reducing duty cycle distortion in differential solid state delay lines, comprising:
- a plurality of substantially identical individual differential delay cell layouts, each individual differential delay cell layouts comprising:
  - a first delay element physical layout having a first input and a first output; and
  - a second delay element physical layout having a second input and a second output, said first delay element physical layout being asymmetrical relative to said second delay element physical layout;
- said plurality of individual differential delay cell layouts being abutted against one another; and
- an even number of said abutted plurality of individual differential delay cell layouts being cross-connected using a twisted delay line interconnect between connected differential delay cell layouts of said physical layout reducing duty cycle distortion in circuitry between the first input and the first output in comparison to circuitry between the second input and the second output, said twisted delay line interconnect comprising:
  - a first output from a preceding differential delay cell layout connected to a second input of a succeeding differential delay cell layout; and
  - a second output from said preceding differential delay cell layout connected to a first input of said succeeding differential delay cell layout.

11. The physical layout for said differential solid state delay line of claim 10, wherein said first delay element physical layout and said second delay element physical layout each form a buffer.

12. The physical layout for said differential solid state delay line of claim 10, wherein said first delay element physical layout and said second delay element physical layout each form an inverter.

13. A method for reducing duty cycle distortion in differential delay lines reducing duty cycle distortion in differential solid state delay lines comprising:
- providing a plurality of substantially identical differential solid state delay cells, each of said plurality of differential solid state delay cells comprising:
  - a first delay element having a first input coupled to a first output and a second delay element having a second input coupled to a second output, at least one present of process asymmetry, layout asymmetry and duty-cycle-induced signal distortion with regards to circuitry between the first input and the first output in comparison to circuitry between the second input and the second output, said first delay element delaying a first electrical signal input to said first input and outputting said first electrical signal on said first output after a delay and said second delay element delaying a second electrical signal input to said second input and outputting said second electrical signal on said second output after said delay; and
- cross-connecting said plurality of differential solid state delay cells in series using a twisted delay line interconnect between connected differential solid state delay cells an even number of times reducing duty cycle distortion in the circuitry between the first input and the first output in comparison to the circuitry between the second input and the second output.

14. The method for reducing duty cycle distortion in differential delay lines of claim 13, wherein said cross-connecting comprises connecting a first output of a preceding differential solid state delay cell to a second input of a succeeding differential solid state delay cell and connecting a second output of said preceding differential solid state delay cell to a first input of said succeeding differential solid state delay cell.

15. The method for reducing duty cycle distortion in differential delay lines of claim 13, wherein said first delay element and said second delay element are both buffers.

16. The method for reducing duty cycle distortion in differential delay lines of claim 13, wherein said first delay element and said second delay element are both inverters.

17. A method for reducing duty cycle distortion in differential solid state delay lines reducing duty cycle distortion, comprising:
- generating a physical layout for a differential solid state delay circuit, said physical layout comprising a first delay element having a first input coupled to a first output and a second delay element having a second input coupled to a second output, at least one present of process asymmetry, layout asymmetry and duty-cycle-induced signal distortion regarding the circuitry between the first input and the first output in comparison to the circuitry between the second input and the second output;
- assembling n stages of said physical layout in series to form an outline of a differential solid state delay line; and
- cross-connecting every x of said n stages using a twisted delay line interconnect between said first delay element and said second delay element, wherein x is an even integer reducing duty cycle distortion in circuitry between the first input and the first output in comparison to circuitry between the second input and the second output.

18. The method of claim 17, wherein cross-connecting comprises connecting a first output of a preceding physical layout to a second input of a succeeding physical layout and connecting a second output of said preceding physical layout to a first input of said succeeding physical layout.

19. An integrated circuit reducing distortion comprising:
- an n-stage differential solid state delay line, comprising:
  - n substantially identical differential delay cells wherein each of said n differential delay cells includes a first input associated with a first output and a second input associated with a second output, at least one present of process asymmetry, layout asymmetry and duty-cycle-induced signal distortion regarding circuitry between the first input and the first output in comparison to circuitry between the second input and the second output, each of said n differential delay cells connected in series for forming said n-stage differential solid state delay line and an even number of said n differential delay cells cross-connected using a twisted delay line interconnect between connected differential delay cells having the first output of a preceding one of said n differential delay cells connected to the second input of a succeeding one of said n differential delay cells and the second output of said preceding one of said n differential delay cells connected to the first input of said succeeding one of said differential delay cells reducing duty cycle distortion in the circuitry between the first input and the first output in comparison to the circuitry between the second input and the second output.

20. An integrated circuit reducing duty cycle distortion comprising:

an n-stage differential solid state delay line, comprising:
n substantially identical differential delay stages, each of said n differential delay stages including a first input associated with a first output and a second input associated with a second output, at least one present of process asymmetry, layout asymmetry and duty-cycle-induced signal distortion regarding circuitry between the first input and the first output in comparison to circuitry between the second input and the second output, each of said n differential delay stages connected in series using a twisted delay line interconnect to form said n-stage differential solid state delay line and every x stages of said n-stage differential solid state delay line cross-connected having the first output of a preceding one of said n differential delay stages connected to the second input of a succeeding one of said n differential delay stages and the second output of said preceding one of said n differential delay stages connected to the first input of said succeeding one of said differential delay stages reducing duty cycle distortion in the circuitry between the first input and the first output in comparison to the circuitry between the second input and the second output;

wherein x is an even integer.

21. An electronic system reducing duty cycle distortion comprising:

an input device;

a processor device in communication with said input device;

an output device in communication with said processor device; and a memory device comprising:
an n-stage differential solid state delay line comprising:
n substantially identical differential delay stages wherein each of said n differential delay stages includes a first input associated with a first output and a second input associated with a second output, at least one present of process asymmetry, layout asymmetry and duty-cycle-induced signal distortion regarding circuitry between the first input and the first output in comparison to circuitry between the second input and the second output, each of said n differential delay stages connected in series to form said n-stage differential solid state delay line and every x stages of said n-stage differential solid state delay line cross-connected using a twisted delay line interconnect having the first output of a preceding one of said n differential delay stages connected to the second input of a succeeding one of said n differential delay stages and the second output of said preceding one of said n differential delay stages connected to the first input of said succeeding one of said differential delay stages reducing duty cycle distortion in the circuitry between the first input and the first output in comparison to the circuitry between the second input and the second output;

wherein x is an even integer.

22. A semiconductor substrate comprising:

at least one integrated circuit (IC) reducing duty cycle distortion comprising:

an n-stage differential solid state delay line, comprising:
n substantially identical differential delay stages wherein each of said n differential delay stages includes a first input associated with a first output and a second input associated with a second output, at least one present of process asymmetry, layout asymmetry and duty-cycle-induced signal distortion regarding circuitry between the first input and the first output in comparison to circuitry between the second input and the second output, each of said n differential delay stages connected in series using a twisted delay line interconnect to form said n-stage differential solid state delay line and every x stages of said n-stage differential solid state delay line cross-connected having the first output of a preceding one of said n differential delay stages connected to the second input of a succeeding one of said n differential delay stages and the second output of said preceding one of said n differential delay stages connected to the first input of said succeeding one of said differential delay stages reducing duty cycle distortion in the circuitry between the first input and the first output in comparison to the circuitry between the second input and the second output;

wherein x is an even integer.

* * * * *